United States Patent
Yamada

(10) Patent No.: US 7,657,812 B2
(45) Date of Patent: Feb. 2, 2010

(54) TEST APPARATUS FOR UPDATING A VALUE OF THE BIT POSITION IN RESULT REGISTER BY EXECUTING A RESULT REGISTER UPDATE INSTRUCTION WITH PREDETERMINED VALUE TO GENERATE TEST PATTERN

(75) Inventor: Tatsuya Yamada, Tokyo (JP)

(73) Assignee: Advantest Corporation, Tokyo (JP)

( * ) Notice: Subject to any disclaimer, the term of this patent is extended or adjusted under 35 U.S.C. 154(b) by 273 days.

(21) Appl. No.: 11/689,503

(22) Filed: Mar. 21, 2007

(65) Prior Publication Data

US 2008/0235498 A1    Sep. 25, 2008

(51) Int. Cl.
G06F 11/00 (2006.01)
(52) U.S. Cl. .................................. 714/738; 714/35
(58) Field of Classification Search .................. None
See application file for complete search history.

(56) References Cited

U.S. PATENT DOCUMENTS 5,737,512 A * 4/1998 Proudfoot et al. ............. 714/32
7,269,770 B1 * 9/2007 Chung et al. ................. 714/727
7,437,645 B2 * 10/2008 Fukuyama et al. ........... 714/736

FOREIGN PATENT DOCUMENTS

| JP | 0773700 | 3/1995 |
| JP | 07073700 | 3/1995 |
| JP | 10271113 | 10/1998 |
| JP | 200040389 | 2/2000 |
| JP | 2004233355 | 8/2004 |
| JP | 2004264047 | 9/2004 |

* cited by examiner

Primary Examiner—Christine T Tu
(74) Attorney, Agent, or Firm—Jianq Chyun IP Office

(57) ABSTRACT

There is provided a test apparatus for testing a device under test. The test apparatus includes an instruction storing section that stores thereon a test instruction sequence, a pattern generating section that sequentially reads and executes an instruction from the test instruction sequence, and outputs a test pattern associated with the executed instruction, a test signal output section that generates a test signal in accordance with the test pattern, and supplies the generated test signal to the device under test, and a result register that stores thereon a value having a predetermined number of bits. Here, the instruction storing section stores thereon the test instruction sequence including therein a result register update instruction to update a value of a designated bit position in the result register with a predetermined value, and when executing the result register update instruction, the pattern generating section updates, with the predetermined value, the value of the bit position in the result register which is designated by the result register update instruction.

7 Claims, 9 Drawing Sheets

TEST INSTRUCTION SEQUENCE

| OFFSET | INSTRUCTION | |
|---|---|---|
| XXX1 | NOP | |
| XXX2 | NOP | |
| ⋮ | ⋮ | |
| XXXX | JMP | X |
| ⋮ | ⋮ | |
| XXXX | IDXI | Y |
| ⋮ | ⋮ | |
| XXXX | SRB | 0100···00 |
| ⋮ | ⋮ | |
| XXXX | RRB | 100···10 |
| ⋮ | ⋮ | |
| XXXX | SR | XXXXXX |
| ⋮ | ⋮ | |
| XXXX | IfFail(SRB) | 0100···00 |
| ⋮ | ⋮ | |
| XXXX | EXIT | |

FIG. 5

TEST APPARATUS FOR UPDATING A VALUE OF THE BIT POSITION IN RESULT REGISTER BY EXECUTING A RESULT REGISTER UPDATE INSTRUCTION WITH PREDETERMINED VALUE TO GENERATE TEST PATTERN

BACKGROUND

1. Technical Field

The present invention relates to a test apparatus and an electronic device. More particularly, the present invention relates to a test apparatus for testing a device under test and an electronic device including therein a test circuit for testing a circuit under test.

2. Related Art

A test apparatus is known which tests a device under test (DUT) such as a semiconductor. The test apparatus supplies a test signal having a predetermined logical pattern to the DUT, detects a signal output from the DUT in response to the supplied test signal, and compares tie detected signal with an expected value, to judge whether the DUT is acceptable.

The test apparatus includes therein a pattern generator for sequentially generating a test pattern and a test signal output section for outputting a test signal having a logical pattern corresponding to the test pattern. The pattern generator sequentially reads an instruction from sequence data (a test instruction sequence) stored on a memory, and executes the read instruction. The pattern generator then reads from the memory pattern data corresponding to the executed instruction, and sequentially outputs the read pattern data as the test pattern. In this way, the test apparatus can supply the test signal having a predetermined logical pattern to the DUT.

The pattern generator has been capable of executing a test instruction to receive a result of comparing tie output signal from the DUT with the expected value and determine a next operation based on the received comparison result, as disclosed in Unexamined Japanese Patent Application Publications No. 2004-264047 and No. H07-73700, for example. However, the pattern generator has difficulties in stocking the results of a plurality of tests conducted on the DUT, so as to generate different test patterns for subsequent tests with reference to the results of the tests or evaluate the DUT based on the results of the tests.

SUMMARY

In view of the above, an advantage of some embodiments of the present invention is to provide a test apparatus and an electronic device which can solve the above-mentioned problem. This advantage is achieved by combining the features recited in the independent claims. The dependent claims define further effective specific example of the present invention.

A first embodiment of the present invention provides a test apparatus for testing a device under test. The test apparatus includes an instruction storing section that stores thereon a test instruction sequence, a pattern generating section that sequentially reads and executes an instruction from the test instruction sequence, and outputs a test pattern associated with the executed instruction, a test signal output section that generates a test signal in accordance with the test pattern, and supplies the generated test signal to the device under test, and a result register that stores thereon a value having a predetermined number of bits. Here, the instruction storing section stores thereon the test instruction sequence including therein a result register update instruction to update a value of a designated bit position in the result register with a predetermined value, and when executing the result register update instruction, the pattern generating section updates, with the predetermined value, the value of the bit position in the result register which is designated by the result register update instruction.

A second embodiment of the present invention provides an electronic device including a circuit under test, and a test circuit that tests the circuit under test. Here, the test circuit includes an instruction storing section that stores thereon a test instruction sequence, a pattern generating section that sequentially reads and executes an instruction from the test instruction sequence, and outputs a test pattern associated with the executed instruction, a test signal output section that generates a test signal in accordance with the test pattern, and supplies the generated test signal to the circuit under test, and a result register that stores thereon a value having a predetermined number of bits. Here, the instruction storing section stores thereon the test instruction sequence including therein a result register update instruction to update a value of a designated bit position in the result register with a predetermined value, and when executing the result register update instruction, the pattern generating section updates, with the predetermined value, the value of the bit position in the result register which is designated by the result register update instruction.

Here, all the necessary features of the present invention are not listed in the summary. The sub-combinations of the features may become the invention.

BRIEF DESCRIPTION OF THE DRAWINGS

FIG. 5 illustrates an example of sequence data (a test instruction sequence) stored on a sequence cache memory 310.

DESCRIPTION OF EXEMPLARY EMBODIMENTS

Hereinafter, one aspect of the present invention will be described through some embodiments. The embodiments do not limit the invention according to the claims, and all the combinations of the features described in the embodiments are not necessarily essential to means provided by aspects of the invention.

Figure 1:
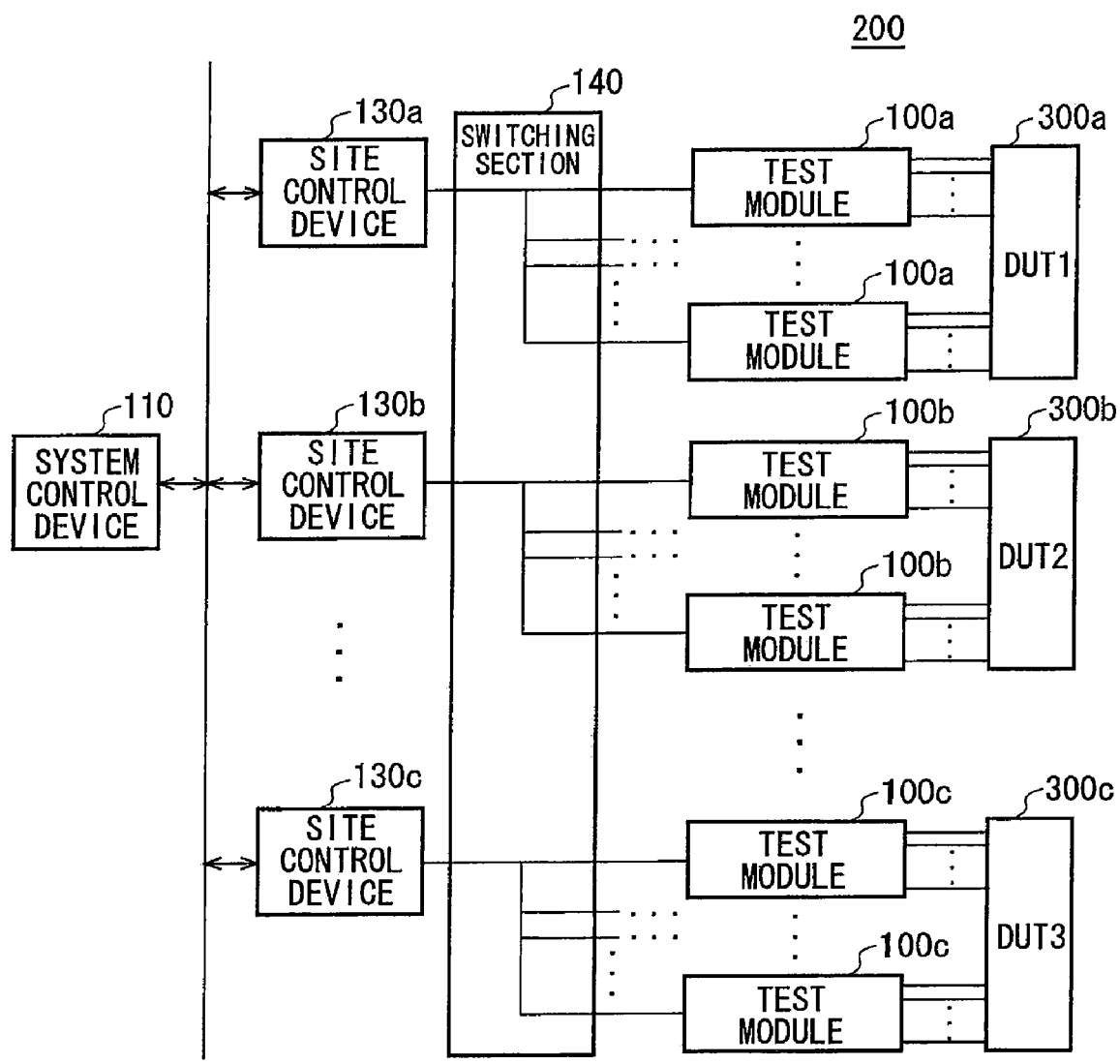
FIG. 1 illustrates an exemplary configuration of a test apparatus 200 relating to an embodiment of the present invention.

FIG. 1 illustrates all exemplary configuration of a test apparatus 200 relating to an embodiment of the present invention. The test apparatus 200 tests devices under test (DUTs) 300 such as semiconductor circuits. The test apparatus 200 includes therein a system control device 110, a plurality of site control devices 130, a switching section 140, and a plurality of test modules 100.

The system control device 110 receives test control programs, test programs, test data and the like which are used by the test apparatus 200 to test the DUTs 300, via an external network or the like, and stores the received programs and data. The system control device 110 is connected to the plurality of site control devices 130 via a communication network.

The site control devices 130a to 130c respectively control tests conducted on the DUTs 300. For example, the plurality of site control devices 130 are provided in a one-to-one correspondence with the plurality of DUTs 300. Each of the site control devices 130 controls a test conducted on a corresponding one of the DUTs 300.

According to the exemplary configuration shown in FIG. 1, the site control device 130a controls the test conducted on the DUT 300a, and the site control device 130b controls the test conducted on the DUT 300b. As an alternative example, each of the plurality of site control devices 130 may control the tests conducted on more than one of the DUTs 300.

Specifically speaking, each of the site control devices 130 obtains a test control program from the system control device 110, and executes the obtained test control program. Subsequently, based on the test control program, the site control device 130 obtains a test program (for example, sequence data described later) and test data (for example, pattern data described later) to use for a test of a corresponding one of the DUTs 300, from the system control device 110. The site control device 130 stores, via the switching section 140, the obtained test program and test data onto one or more modules (for example, one or more of the test modules 100) which are to be used for testing the corresponding DUT 300. Following this, the site control device 130 instructs, via the switching section 140, the test modules 100 to start conducting a test based on the test program and test data. When receiving an interrupt or the like indicating the completion of the test from, for example, the test modules 100, the site control device 130 instructs the test modules 100 to conduct the next test based on the result of the test.

The switching section 140 connects each of the plurality of site control devices 130 to corresponding one or more of the test modules 100, which are controlled by the site control device 130, and relays the communication between the site control device 130 and corresponding test modules 100. Here, a predetermined one of the site control devices 130 may configure the switching section 140, based on the instruction by the user of the test apparatus 200, test control program or the like, so that each of the plurality of site control devices 130 is connected to one or more of the test modules 100 used by the site control device 130 to test a corresponding one of the DUTs 300.

According to the exemplary configuration shown in FIG. 1, for example, the site control device 130a is configured so as to be connected to a plurality of test modules 100a, and uses the test modules 100a to test the DUT 300a. Here, the configuration and operations of the site control device 130a for testing the DUT 300a are substantially the same as those of the other site control devices 130 for testing the corresponding DUTs 300 by using the corresponding test modules 100.

The following description is made with a focus on the configuration and operations of the site control device 130a for testing the DUT 300a.

Based on an instruction by the site control device 130a, the test modules 100a generate timing signals indicating timings to generate test signals to be used to test the DUT 300a. One of the test modules 100a may receive a result of a test conducted by a different one of the test modules 100a, and cause the test modules 100a to execute sequence data corresponding to the received result of the test.

Each of the test modules 100a is connected to some of the plurality of terminals of the DUT 300a. The test module 100a conducts a test of the DUT 300a based on the sequence data and pattern data which are stored thereon by the site control device 130a. The test module 100a tests the DUT 300a based on the sequence data designated by a pattern list (described later) and pattern data. Specifically speaking, the test module 100a generates test signals based on the pattern data, and supplies the generated test signals to the terminals of the DUT 300a connected to the test module 100a.

Following this, the test module 100a obtains output signals which are output from the DUT 300a as a result of operations based on the supplied test signals, and compares the obtained output signals with expected values. Here, when generating the test signals based on the sequence data and pattern data, each of the test modules 100a may generate a group of test signals in accordance with a different cycle rate so as to achieve a dynamically different cycle rate for each group of the test signals.

Each of the test modules 100a generates an interrupt to the site control device 130a when the processes based on the test program are completed, an abnormal condition occurs during the execution of the test program, or the like. The interrupt is sent via the switching section 140 to the site control device 130a corresponding to the test module 100a, so that the processor provided in the site control device 130a handles the interrupt.

Referring to the above-described configurations, the test apparatus 200 is realized based on open architecture. The test apparatus 200 can be configured by using a variety of modules satisfying the open architecture standards. When the test apparatus 200 is used, modules such as the test modules 100 may be inserted into a connection slot of the switching section 140.

In this case, the user or the like of the test apparatus 200 may change, via the site control device 130a for example, the connection established by the switching section 140, so that the modules to be used for a test of one of the DUTs 300 are connected to a corresponding one of the site control devices 130 which controls the test to be conducted on the DUT 300. With this configuration, the user of the test apparatus 200 can select appropriate modules depending on information relating to each of the DUTs 300 such as the number of the terminals, the positions of the terminals and the terminal types, and the type of the test, and mount the selected modules on the test apparatus 200.

The test apparatus 200 or test modules 100 may be configured as a test circuit provided in an electronic device in which a circuit under test to be tested by the test circuit is also provided. The test circuit is configured by a BIST circuit or the like of the electronic device. The test circuit tests the circuit under test in order to, for example, judge the acceptability of the electronic device. By conducting the test, the test circuit can examine whether the circuit under test can realize normal operations corresponding to the original purpose of the electronic device.

Alternatively, the test apparatus 200 or test modules 100 may be configured as a test circuit provided in a board or apparatus in which a circuit under test to be tested by the test circuit is also provided. Such a test circuit can also examine whether the circuit under test can realize normal operations corresponding to the original purpose of the board or apparatus, similarly to the above-mentioned case.

Figure 2:
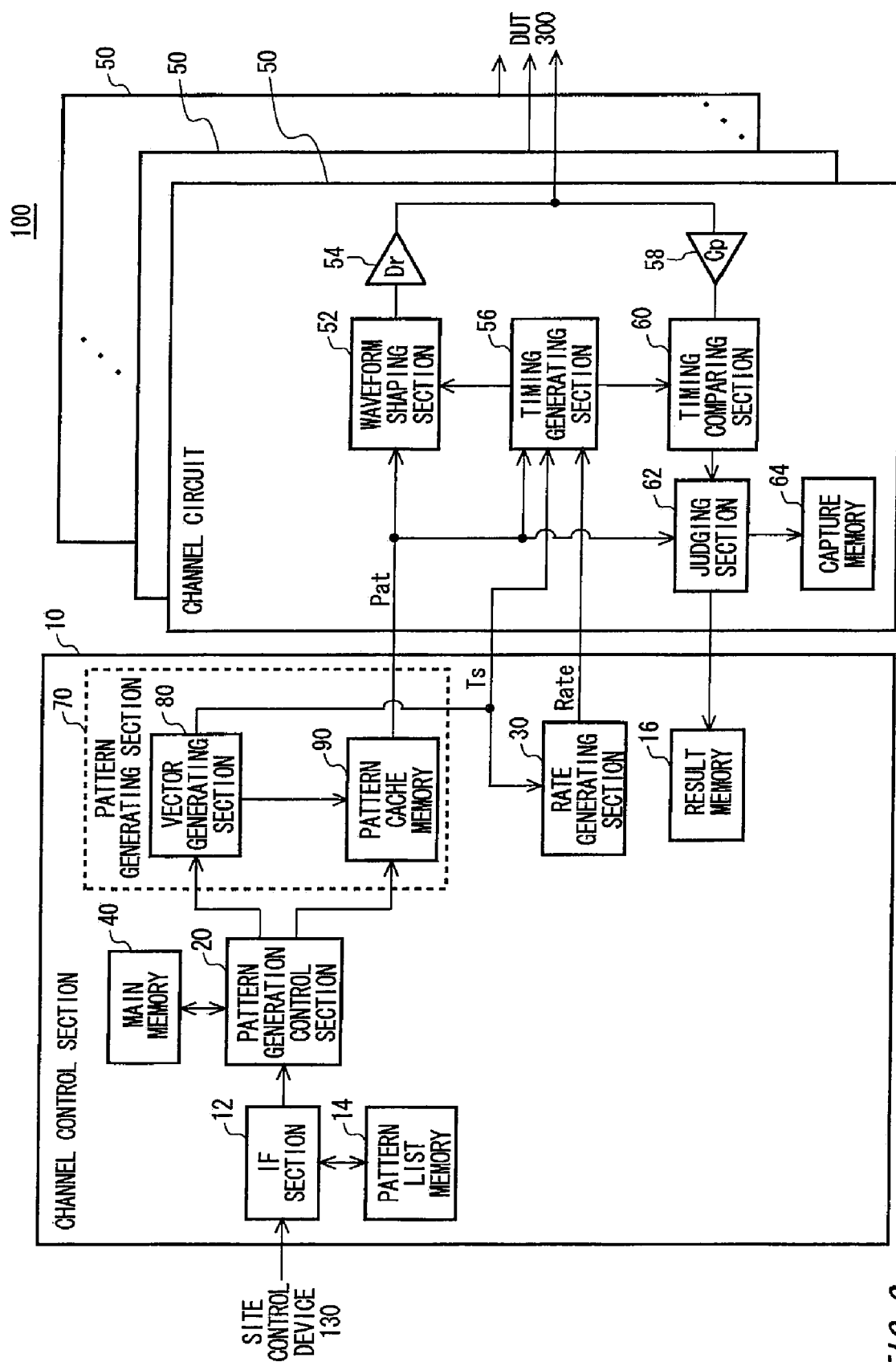
FIG. 2 illustrates an exemplary configuration of a test module 100.

FIG. 2 illustrates an exemplary configuration of each of the test modules 100. The test module 100 includes therein a channel control section 10 and a plurality of channel circuits 50. The following describes the functions and configurations of one of the channel circuits 50. However all of the channel circuits 50 may have the same functions and configurations.

Each of the channel circuits 50 may be connected to a corresponding one of input/output (I/O) pins of one of the DUTs 300, and supply a test signal to the corresponding I/O pin. The channel circuit 50 may measure an output signal output from the corresponding I/O pin. Here, the I/O pins of the DUT 300 each may be either an input pin or an output pin.

The channel control section 10 controls the channel circuits 50. For example, the channel control section 10 controls each of the channel circuits 50 to cause the channel circuit 50 to generate the test signal. Also, the channel control section 10 controls each of the channel circuits 50 to cause the channel circuit 50 to measure the output signal from the DUT 300.

Here, the channel control section 10 may use a result of the measurement done by one of the channel circuits 50 in order to control one or more of the other channel circuits 50. For example, until the result of the measurement done by one of the channel circuits 50 satisfies a predetermined condition, the channel control section 10 may cause at least one of the remaining channel circuits 50 to perform a predetermined operation repeatedly. When the result of the measurement satisfies the predetermined condition, the channel control section 10 may cause the at least one of the remaining channel circuits 50 to perform the next operation.

The channel control section 10 includes therein an interface (IF) section 12, a pattern list memory 14, a result memory 16, a pattern generation control section 20, a main memory 40, a rate generating section 30, and a pattern generating section 70. The interface section 12 exchanges data between a corresponding one of the site control devices 130 and the test module 100.

The main memory 40 stores thereon pieces of sequence data of different types and pieces of pattern data corresponding to each piece of sequence data. The main memory 40 may store thereon the sequence data and pattern data supplied from the corresponding site control device 130, before the test of the DUT 300 is conducted.

For example, the site control device 130 may input, into the interface section 12, sequence data, pattern data and an instruction to store the sequence data and pattern data into a designated address of the main memory 40. The pattern generation control section 20 stores the sequence data and pattern data into the main memory 40 in accordance with the instruction received by the interface section 12.

The sequence data may indicate, for example, a group of instructions to be sequentially executed (a test instruction sequence). The pattern data may indicate, for example, a logical value pattern. The pieces of pattern data may be stored in a one-to-one correspondence with a plurality of instructions. For example, the sequence data may be an instruction group for generating test patterns by outputting the pieces of pattern data in a predetermined order.

When the test patterns are generated based on the sequence data, each of the pieces of pattern data may be used more than one time. Here, the sequence data may include therein a loop instruction, a jump instruction and the like, for example. By executing such sequence data, the channel control section 10 expands the corresponding pieces of pattern data so as to generate test signals corresponding to the sequence data and pattern data. The sequence data and pattern data stored on the main memory 40 are described later with reference to FIG. 3.

The pattern list memory 14 stores thereon a pattern list indicating the order in which the pieces of sequence data stored on the main memory 40 are executed. For example, the pattern list memory 14 may store thereon a pattern list which sequentially indicates the address in the main memory 40 at which sequence data to be executed is stored. The pattern list memory 14 may store thereon the pattern list supplied from the corresponding site control device 130, before the test of the DUT 300 is conducted, similarly to the main memory 40. The pattern list may be one example of the above-mentioned test control program, or part of the test control program.

When the test of the DUT 300 is started, the pattern generation control section 20 reads the pattern list from the pattern list memory 14. For example, on reception of an instruction to start a test from the site control device 130, the pattern generation control section 20 may read the pattern list from the pattern list memory 14.

The pattern generation control section 20 reads sequence data stored on the main memory 40, and corresponding pieces of pattern data which are also stored on the main memory 40 in accordance with the order indicated by the pattern list. The pattern generation control section 20 sends the read sequence data to a vector generating section 80 of the pattern generating section 70. Also, the pattern generation control section 20 sends the read pieces of pattern data to a pattern cache memory 90 in the pattern generating section 70.

When a free space of a predetermined size is created in a cache memory, FIFO and the like of the circuits of the subsequent stages, the pattern generation control section 20 may read and send next sequence data and corresponding pieces of pattern data. In this case, under the condition that a free space of a predetermined size is created in each one of the cache memory, FIFO and the like which are designed to store sequence data and corresponding pieces of pattern data, the pattern generation control section 20 may read the next sequence data and corresponding pieces of pattern data, and send the read sequence data and corresponding pieces of pattern data to the cache memory, FIFO and the like.

The pattern generating section 70 sequentially generates a test pattern based on a combination of the sequence data and corresponding pieces of pattern data which is sequentially received from the pattern generation control section 20. According to the present embodiment, the pattern generating section 70 includes therein the vector generating section 80 and pattern cache memory 90.

As described above, the vector generating section 80 receives the sequence data from the pattern generation control section 20. The vector generating section 80 may include therein a sequence cache memory for storing the received sequence data. The pattern cache memory 90 receives the corresponding pieces of pattern data from the pattern generation control section 20, and stores the received pieces of pattern data respectively at predetermined addresses.

The vector generating section 80 sequentially executes the instructions of the sequence data stored on the sequence cache memory, and sequentially designates an address in the pattern cache memory 90. For example, each of the instructions making up the sequence data may be associated with an address of pattern data which is to be designated for the instruction. The vector generating section 80 sequentially designates an address in the pattern cache memory 90, in correspondence with a loop instruction, a jump instruction and the like included in the sequence data.

The pattern cache memory 90 outputs pattern data stored on the sequentially designated address. With the above-described configurations, the pattern generating section 70 can generate test patterns having logical patterns, based on the sequence data and corresponding pieces of pattern data. When the execution of the sequence data is completed, the storage regions of the sequence cache memory and pattern cache memory 90 on which the sequence data and corresponding pieces of pattern data have been stored may be released. Here, the sequence data may include, at the end of the instruction group, an end instruction indicating the end of the sequence data.

Each of the channel circuits 50 shapes a test signal based on the test pattern output from the pattern generating section 70, and inputs the test signal into the DUT 300. Also, the channel circuit 50 measures an output signal from the DUT 300. The channel circuit 50 includes therein a waveform shaping section 52, a driver 54, a timing generating section 56, a comparator 58, a timing comparing section 60, a judging section 62, and a capture memory 64.

The waveform shaping section 52 shapes the test signal based on the test pattern generated by the pattern generating section 70. For example, the waveform shaping section 52 may generate the test signal having a logical pattern corresponding to the test pattern. The waveform shaping section 52 may generate the test signal in accordance with a timing signal supplied thereto. For example, the waveform shaping section 52 may generate the test signal the logical value of which transits in synchronization with the timing signal supplied thereto.

The driver 54 inputs the test signal generated by the waveform shaping section 52 into the DUT 300. The driver 54 may convert the level of the voltage of the test signal into the level of the signal to be input into the DUT 300, by outputting a voltage of a predetermined H level when the test signal generated by the waveform shaping section 52 indicates the H logic, and outputting a voltage of a predetermined L level when the test signal indicates the L logic.

The comparator 58 may receive the output signal from the DUT 300, and compare the voltage level of the output signal with a predetermined reference level, so as to convert the output signal into a binary logical signal. For example, the comparator 58 may output the H logic when the voltage level of the output signal is higher than the reference level, and output the L logic when the voltage level of the output signal is equal to or lower than the reference level.

The timing comparing section 60 obtains the logical value of the signal output from the comparator 58 in synchronization with a strobe signal supplied thereto. In this way, the timing comparing section 60 can detect the logical pattern of the output signal.

The timing generating section 56 generates the above-mentioned timing signal and strobe signal based on the values of the timing set supplied thereto in advance. For example, the timing generating section 56 may generate the timing signal and strobe signal by delaying a rate signal which has a rate determined based on the timing set and is supplied thereto from the rate generating section 30, by a time delay determined in accordance with the timing set supplied thereto.

Here, the timing set may be supplied to the rate generating section 30 and timing generating section 56 every time the pattern generating section 70 executes one of the instructions making up sequence data, for example. The data of the timing set may be stored on the main memory 40, for example, in a state of being included in the pieces of pattern data corresponding to the sequence data. Every time the pattern generating section 70 executes one of the instructions making up sequence data, the pattern generating section 70 may assign the timing set corresponding to the executed instruction to the rate generating section 30 and timing generating section 56.

The judging section 62 compares the logical pattern detected by the timing comparing section 60 with an expected value pattern. In this way, the judging section 62 can judge whether the DUT 300 is acceptable. The expected value pattern may be generated by the pattern generating section 70. For example, the expected value pattern may be the same as the logical pattern of the test signal input into the DUT 300 which is included in the test pattern generated by the pattern generating section 70. The judging section 62 may supply the result of the judgment (pass or fail) to the pattern generating section 70.

The capture memory 64 stores thereon the result of the judgment made by the judging section 62. For example, the capture memory 64 may store thereon the result of the judgment (pass or fail) made by the judging section 62 in association with each test pattern. The capture memory 64 may select and store thereon the fail results of the judgment made by the judging section 62.

The result memory 16 of the channel control section 10 stores thereon the results of the judgment made by the judging section 62 of each of the channel circuits 50. The result memory 16 may store the result of the judgment (pass or fail) made by the judging section 62 in terms of each test pattern, in association with each of the channel circuits 50. The result memory 16 may select and store the fail results of the judgment made by the judging section 62 of each of the channel circuits 50.

As described above, the capture memory 64 may store thereon fail information for each test pattern, in association with the corresponding channel circuit 50. On the other hand, the result memory 16 may store fail information for each piece of sequence data stored on the pattern list memory 14, in association with, for example, the corresponding DUT 300.

Figure 3:
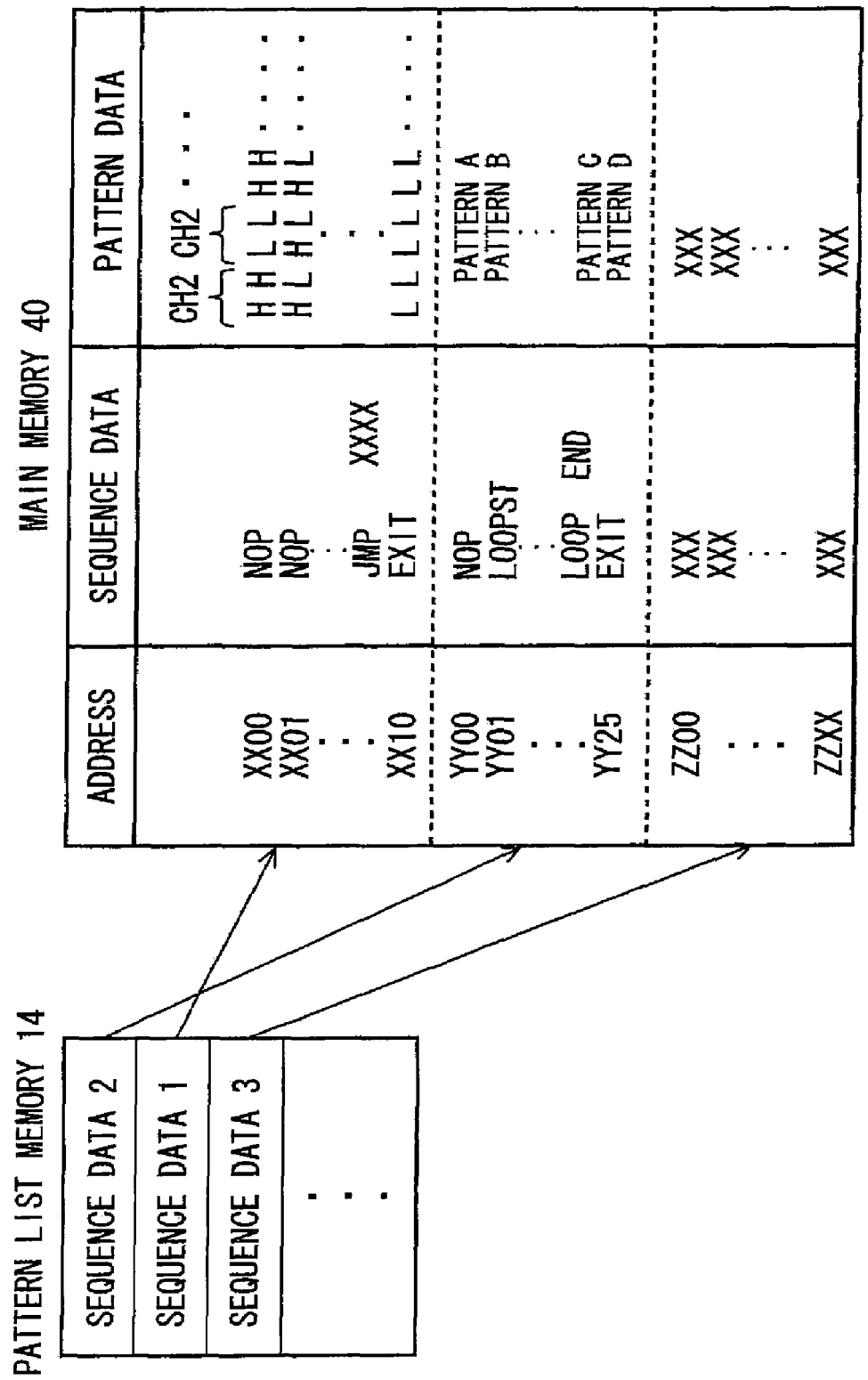
FIG. 3 illustrates, as an example, a pattern list stored on a pattern list memory 14, and sequence data and pattern data stored on a main memory 40.

FIG. 3 illustrates, as an example, the pattern list stored on the pattern list memory 14, the sequence data and pattern data stored on the main memory 40. As mentioned above, the main memory 40 stores thereon a plurality of pieces of sequence data (sequence data 1, sequence data 2, . . . ) and pieces of pattern data corresponding to each piece of sequence data.

As described above, a piece of sequence data includes therein a plurality of instructions. When executing each of the instructions, the pattern generating section 70 may output pattern data corresponding to the executed instruction. For example, the sequence data may include a NOP instruction, a JMP instruction, a LOOP instruction and the like. When executing the NOP instruction, the pattern generating section 70 outputs corresponding pattern data and moves to the next instruction. When executing the JMP instruction, the pattern generating section 70 outputs corresponding pattern data and jumps to an instruction at a predetermined address. When executing the LOOP instruction, the pattern generating section 70 outputs corresponding pattern data and repeatedly executes one or more instructions at a designated range of addresses at a predetermined number of times.

By executing a group of the above-described instructions, the pattern generating section 70 outputs the corresponding pieces of pattern data in the order determined by the sequence data, thereby generating predetermined test patterns. For example, when executing the sequence data 2, the pattern generating section 70 first outputs pattern data A, and then repeatedly outputs pieces of pattern data from pattern data B to pattern data C at a certain number of times which is designated by the LOOP instruction.

Here, the main memory 40 may store thereon sequence data corresponding to more than one channel circuit 50. The main memory 40 may store thereon pattern data corresponding to each of the channel circuits 50. For example, the main memory 40 may store thereon pattern data corresponding to each of the channel circuits 50, in association with each of the instructions making up the sequence data. According to the example shown in FIG. 3, the main memory 40 stores pattern data corresponding to each of the channel circuits 50 at a different bit position, at each of the addresses.

The pattern list memory 14 stores thereon the order of executing the pieces of sequence data. According to the example shown in FIG. 3, the pattern list memory 14 stores thereon a pattern list indicating that the sequence data 2 is first executed, and the sequence data 1 is then executed.

According to the exemplary configuration shown in FIG. 2, the main memory 40 for storing sequence data and pattern data is provided in the channel control section 10. In other embodiments, however, the main memory 40 provided in the channel control section 10 may store the sequence data, and a different memory may be provided in each of the channel circuits 50 for storing pattern data for the corresponding channel circuit 50.

If such is the case, the pattern cache memory 90 may be provided in each of the channel circuits 50. The address which is sequentially designated by the vector generating section 80 may be delivered to the pattern cache memory 90 provided in each of the channel circuits 50.

Figure 4:
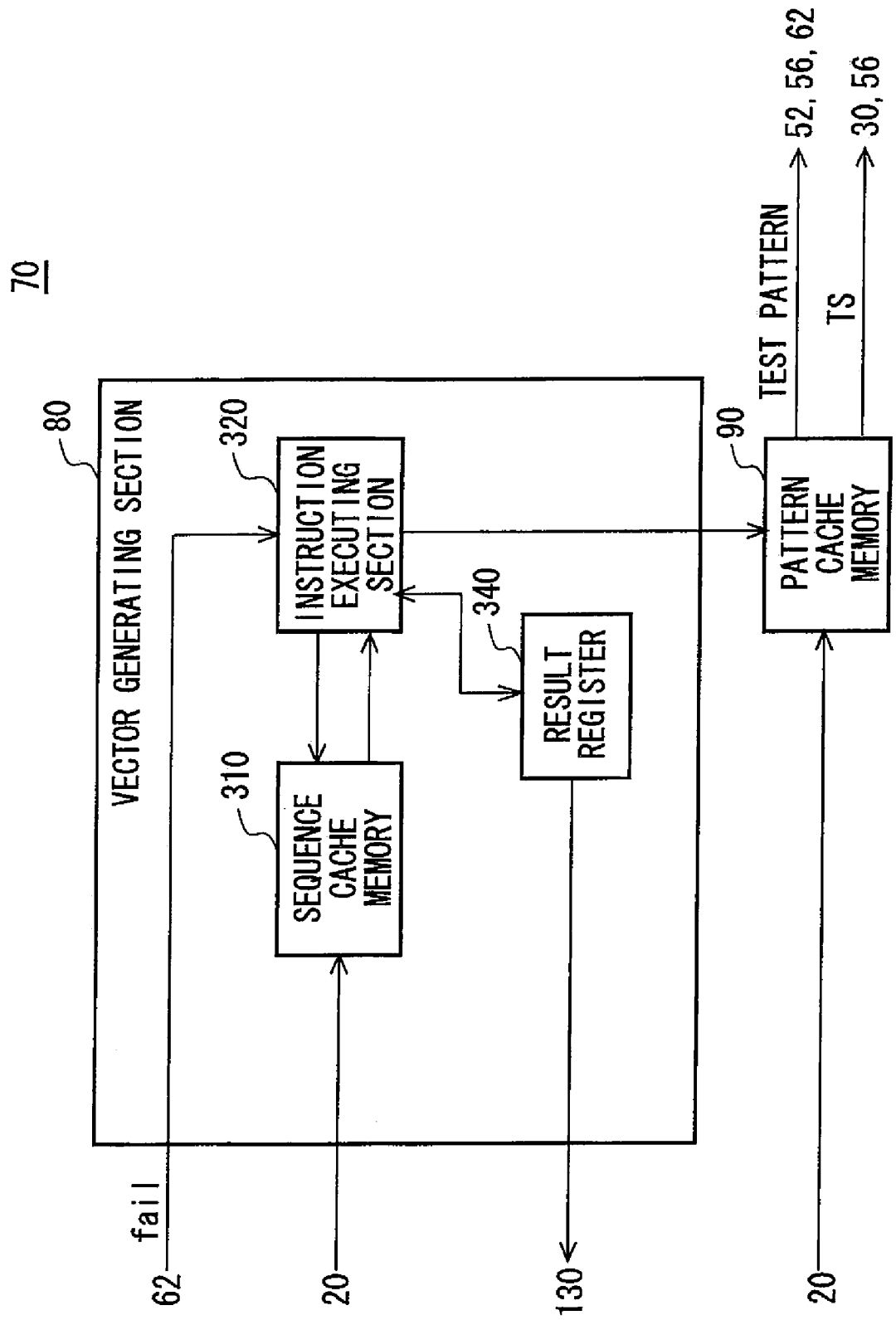
FIG. 4 illustrates an exemplary configuration of a pattern generating section 70 relating to the present embodiment.

FIG. 4 illustrates an exemplary configuration of the pattern generating section 70 relating to the present embodiment. The vector generating section 80 includes therein a sequence cache memory 310, an instruction executing section 320, and a result register 340. The sequence cache memory 310 receives the sequence data (the test instruction sequence) from the pattern generation control section 20, and stores thereon the received sequence data. The sequence chance memory 310 is shown as an example of an instruction storing section relating to the present invention.

The instruction executing section 320 sequentially reads an instruction from the test instruction sequence stored on the sequence cache memory 310, and executes the read instruction. Here, each of the instructions making up the test instruction sequence is assigned with an offset indicating the position of the instruction within the test instruction sequence.

When executing the instruction, the instruction executing section 320 converts the offset assigned to the executed instruction into an address in the pattern cache memory 90 at which pattern data associated with the executed instruction is stored. The instruction executing section 320 supplies the address to the pattern cache memory 90, and causes the pattern cache memory 90 to output the pattern data associated with the executed instruction. Here, the pattern cache memory 90 supplies the pattern data to each of the channel circuits 50 as the test pattern. The channel circuit 50 generates a test signal in accordance with the test pattern supplied thereto, and supplies the generated test signal to the DUT 300. The pattern cache memory 90 supplies the test pattern to, for example, the waveform shaping section 52, timing generating section 56, and judging section 62.

Here, each of the instructions making up the sequence data is associated with timing set information (TS) designating a combination of timings for output of the corresponding test pattern. When executing the instruction, the instruction executing section 320 causes the pattern cache memory 90 to output the timing set information associated with the executed instruction, to the rate generating section 30 and timing generating section 56, in association with the test pattern output from the pattern cache memory 90.

The instruction executing section 320 executes the instructions making up the test instruction sequence, from the initial instruction thereof, in the order defined by the test instruction sequence. Here, the instruction executing section 320 repeatedly performs an operation of executing an instruction, identifying the offset of the next instruction to execute which is determined by the executed instruction, reading the instruction which is assigned with the identified offset from the test instruction sequence stored on the sequence cache memory 310, and executing the read instruction.

The result register 340 stores thereon a value having a predetermined number of bits. The result register 340 may store thereon a 24-bit value, for example. The instruction executing section 320 can read the value stored on the result register 340. The corresponding site control device 130 can also read the value stored on the result register 340.

The instruction executing section 320 can update the value stored on the result register 340. The instruction executing section 320 can update the value stored on the result register 340 in units of bits. The instruction executing section 320 may be configured to update the value stored on the result register 340 in units of words.

FIG. 5 illustrates an example of the sequence data (the test instruction sequence) stored on the sequence cache memory 310. For example, the sequence data includes therein a NOP instruction, a jump instruction (a JMP instruction), a standby instruction (an IDXI instruction), an end instruction (an EXIT instruction), a result register update instruction (an SRB instruction and an RRB instruction), a result register input instruction (an SR instruction), and a conditional result register update instruction (an IfFail(SRB) instruction and an IfFail(RRB) instruction).

When executing the NOP instruction, the instruction executing section 320 identifies, as the next instruction to execute, an instruction assigned with an offset which immediately follows the offset assigned to the executed NOP instruction. When executing the jump instruction (the JMP instruction), the instruction executing section 320 identifies, as the next instruction to execute, an instruction assigned with an offset designated by the executed JMP instruction.

The standby instruction (the IDXI instruction) is an instruction to cause corresponding pattern data to be repeatedly output at the designated number of times. When executing the IDXI instruction, the instruction executing section 320 does not process the next instruction until the number of cycles reaches the designated number after the instruction executing section 320 executes the IDXI instruction. When executing the IDXI instruction, the instruction executing section 320 identifies, as the next instruction to execute, an instruction assigned with an offset which immediately follows the offset of the executed IDXI instruction, after the number of cycles reaches the designated number.

The end instruction (the EXIT instruction) is an instruction to end the execution of the main test instruction sequence. When executing the EXIT instruction, the instruction executing section 320 does not identify the next instruction to execute, and ends the execution of the main test instruction sequence.

The result register update instruction (the SRB instruction and RRB instruction) is an instruction to update a value of a designated bit position in the result register 340 with a predetermined value. When executing the result register update instruction (the SRB instruction and RRB instruction), the instruction executing section 320 updates, with a predetermined value, the value of the bit position, in the result register 340, which is designated by the executed result register update instruction. When executing the result register update instruction (the SRB instruction and RRB instruction), the instruction executing section 320 identifies, as the next instruction to execute, an instruction assigned with an offset which immediately follows the offset of the executed result register update instruction.

The SRB instruction is an example of the result register update instruction. The SRB instruction is an instruction to set the value of a designated bit position in the result register 340 to "1". The operand of the SRB instruction is, for example, data in which a bit corresponding to a bit in the result register 340 which is to be set has a value of "1" and a bit corresponding to a bit in the result register 340 which is not to be changed has a value of "0". When executing the SRB instruction, the instruction executing section 320 updates the value stored on the result register 340 by calculating a logical OR between the value stored on the result register 340 and data in which a bit corresponding to a bit in the result register 340 which is to be set has a value of "1" and a bit corresponding to a bit in the result register 340 which is not to be changed has a value of "0".

As an alternative example, the operand of the SRB instruction may be data in which a bit corresponding to a bit in the result register 340 which is to be set has a value of "0" and a bit corresponding to a bit in the result register 340 which is not to be changed has a value of "1". If such is the case, when executing the SRB instruction, the instruction executing section 320 updates the value stored on the result register 340 by calculating a logical OR between the value stored on the result register 340 and data generated by inverting each bit of the data in which a bit corresponding to a bit in the result register 340 which is to be set has a value of "0" and a bit corresponding to a bit in the result register 340 which is not to be changed has a value of "1".

The RRB instruction is an example of the result register update instruction. The RRB instruction is an instruction to reset the value of a designated bit position in the result register 340 to "0". The operand of the RRB instruction is, for example, data in which a bit corresponding to a bit in the result register 340 which is to be reset has a value of "1" and a bit corresponding to a bit in the result register 340 which is not to be changed has a value of "0". When executing the RRB instruction, the instruction executing section 320 updates the value stored on the result register 340 by calculating a logical AND between the value stored on the result register 340 and data generated by inverting each bit of data in which a bit corresponding to a bit in the result register 340 which is to be reset has a value of "1" and a bit corresponding to a bit in the result register 340 which is not to be changed has a value of "0".

As an alternative example, the operand of the RRB instruction may be data in which a bit corresponding to a bit in the result register 340 which is to be reset has a value of "0" and a bit corresponding to a bit in the result register 340 which is not to be changed has a value of "1". If such is the case, when executing the RRB instruction, the instruction executing section 320 updates the value stored on the result register 340 by calculating a logical AND between the value stored on the result register 340 and data in which a bit corresponding to a bit in the result register 340 which is to be reset has a value of "0" and a bit corresponding to a bit in the result register 340 which is not to be changed has a value of "1".

The result register input instruction (the SR instruction) is an instruction to store a designated value onto the result register 340. When executing the result register input instruction (the SR instruction), the instruction executing section 320 stores a value designated by, for example, the operand of the executed SR instruction onto the result register 340. When executing the SR instruction, the instruction executing section 320 identifies, as the next instruction to execute, an instruction assigned with an offset which immediately follows the offset of the executed SR instruction.

The conditional result register update instruction (the IfFail(SRB) instruction and IfFail(RRB) instruction) is an instruction to update the value of a designated bit position in the result register 340 with a predetermined value, under the condition that a predetermined test result is obtained. For example, when executing the conditional result register update instruction, the instruction executing section 320 may update the value of the designated bit position in the result register 340 with a predetermined value, under the condition that the test result obtained by the judging section 62 indicates Fail.

When executing the conditional result register update instruction, the instruction executing section 320 updates, with a predetermined value, the value of a bit position in the result register 340 which is designated by the executed conditional result register update instruction, under the condition that a predetermined test result is obtained. When executing the conditional result register update instruction, the instruction executing section 320 identifies, as the next instruction to execute, an instruction assigned with an offset which immediately follows the offset of the executed SR instruction.

The IfFail(SRB) instruction is an instruction to execute the same process as when the SRB instruction is executed, under the condition that the test result obtained by the judging section 62 indicates Fail. When executing the IfFail(SRB) instruction, the instruction executing section 320 performs the same process as when executing the SRB instruction, under the condition that the test result obtained by the judging section 62 indicates Fail.

The Iffail(RRB) instruction is an instruction to execute the same process as when the RRB instruction is executed, under the condition that the test result obtained by the judging section 62 indicates Fail. When executing the IfFail(RRB) instruction, the instruction executing section 320 performs the same process as when executing the RRB instruction, under the condition that the test result obtained by the judging section 62 indicates Fail.

As described above, the instruction executing section 320 can update the value of a desired bit position in the result register 340, in accordance with the instruction supplied thereto. This configuration enables the instruction executing section 320 to store the results of conducted tests onto the result register 340.

Here, the sequence data may include an instruction to update the value of a designated bit position in the result register 340 with a predetermined value only when a parameter other than the test result satisfies a predetermined condition. For example, the sequence data may include an instruction to update the value of a designated bit position in the result register 340 with a predetermined bit value, when a result of judgment which is normally made at a branch point satisfies a predetermined condition, for example, under the condition that the register value is changed to a predetermined value, the flag indicates a predetermined value, or the flag does not indicate a predetermined value. When executing such an instruction, the instruction executing section 320 performs the same process as when executing the SRB or RRB instruction, when a predetermined condition is satisfied.

Figure 6:
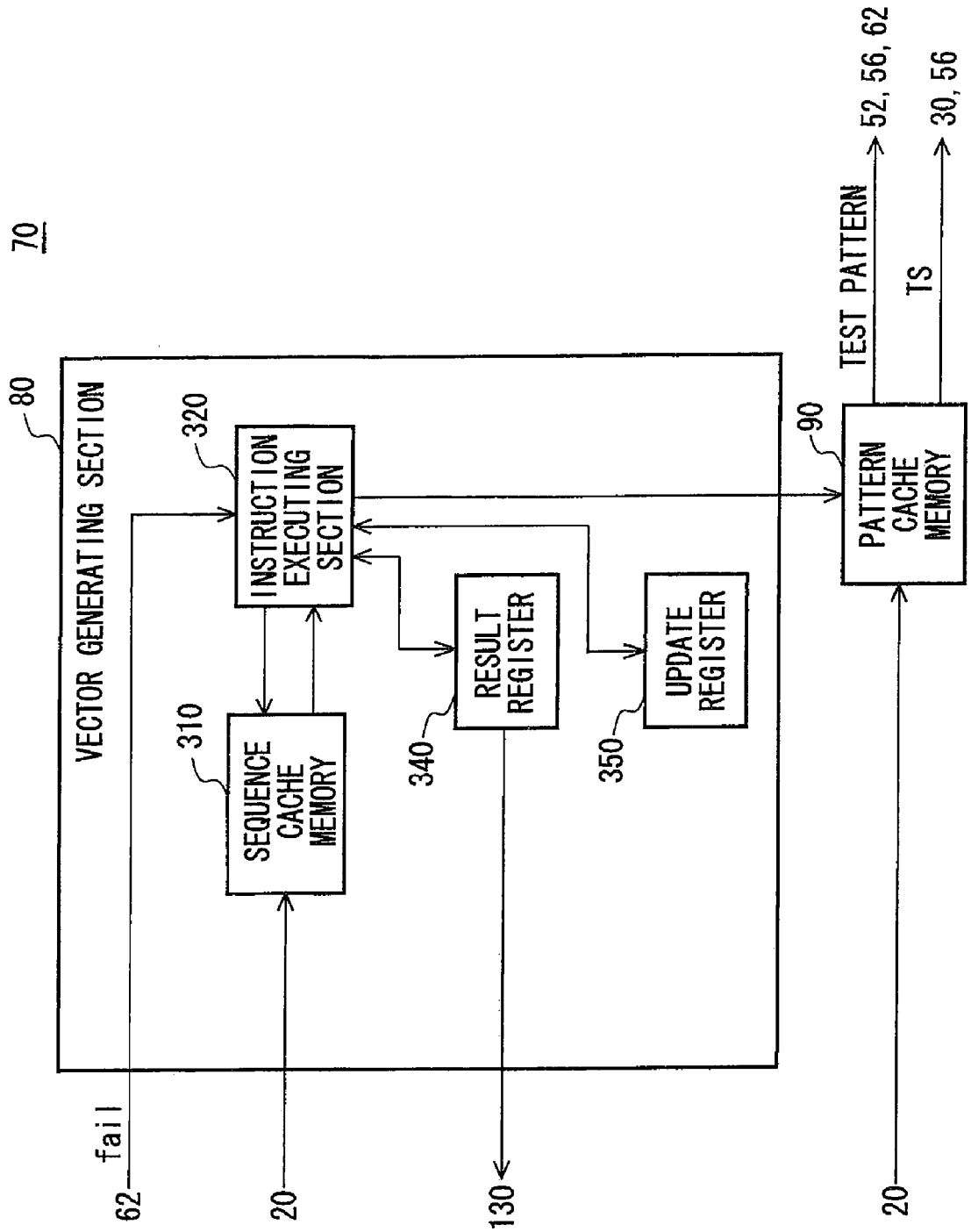
FIG. 6 illustrates an exemplary configuration of the pattern generating section 70 relating to a modification example of the present embodiment.

FIG. 6 illustrates an exemplary configuration of the pattern generating section 70 relating to a modification example of the present embodiment. The pattern generating section 70 relating to the present modification example has substantially the same constituents and functions as the pattern generating section 70 relating to the embodiment shown in FIG. 4. Therefore, the following description is made only with a focus on the differences.

The vector generating section 80 may further include therein an update register 350. The update register 350 stores thereon a value designating a bit position in the result register 340 whose value is to be updated.

The value stored on the update register 350 is readable by the instruction executing section 320. The value stored on the update register 350 is input thereto by the instruction executing section 320. For example, the update register 350 may store thereon data with the same number of bits as the data stored on the result register 340. In the data stored on the update register 350, a bit corresponding to a bit in the result register 340 which is to be updated has a predetermined value, and a bit corresponding to a bit in the result register 340 which is not to be changed has a different value.

According to the present modification example, when executing the result register update instruction, the instruction executing section 320 updates the value of a bit position, in the result register 340, which is designated by the value stored on the update register 350, with a predetermined value. For example, the update register 350 may store thereon data in which a bit corresponding to a bit in the result register 340 which is to be set has a value of "1" and a bit corresponding to a bit in the result register 340 which is not to be changed has a value of "0". When executing the SRB instruction, the instruction executing section 320 updates the value stored on the result register 340 by calculating a logical OR between the value stored on the result register 340 and the data stored on the update register 350. In this way, the instruction executing section 320 can set the value of the bit position in the result register 340 which is designated by the value stored on the update register 350 to "1".

As an alternative example, the update register 350 may store thereon data in which a bit corresponding to a bit in the result register 340 which is to be set has a value of "0" and a bit corresponding to a bit in the result register 340 which is not to be changed has a value of "1". In this case, when executing the SRB instruction, the instruction executing section 320 updates the value stored on the result register 340 by calculating a logical OR between the value stored on the result register 340 and data generated by inverting each bit of the data stored on the update register 350.

As another example, the update register 350 may store thereon data in which a bit corresponding to a bit in the result register 340 which is to be reset has a value of "1" and a bit corresponding to a bit in the result register 340 which is not to be changed has a value of "0". When executing the RRB instruction, the instruction executing section 320 updates the value stored on the result register 340 by calculating a logical AND between the value stored on the result register 340 and data generated by inverting each bit of the data stored on the update register 350. In this way, the instruction executing section 320 can reset the value of the bit position in the result register 340 which is designated by the value stored on the update register 350 to "0".

As another example, the update register 350 may store thereon data in which a bit corresponding to a bit in the result register 340 which is to be reset has a value of "0" and a bit corresponding to a bit in the result register 340 which is not to be changed has a value of "1". In this case, when executing the RRB instruction, the instruction executing section 320 updates the value stored on the result register 340 by calculating a logical AND between the value stored on the result register 340 and the data stored on the update register 350.

Figure 7:
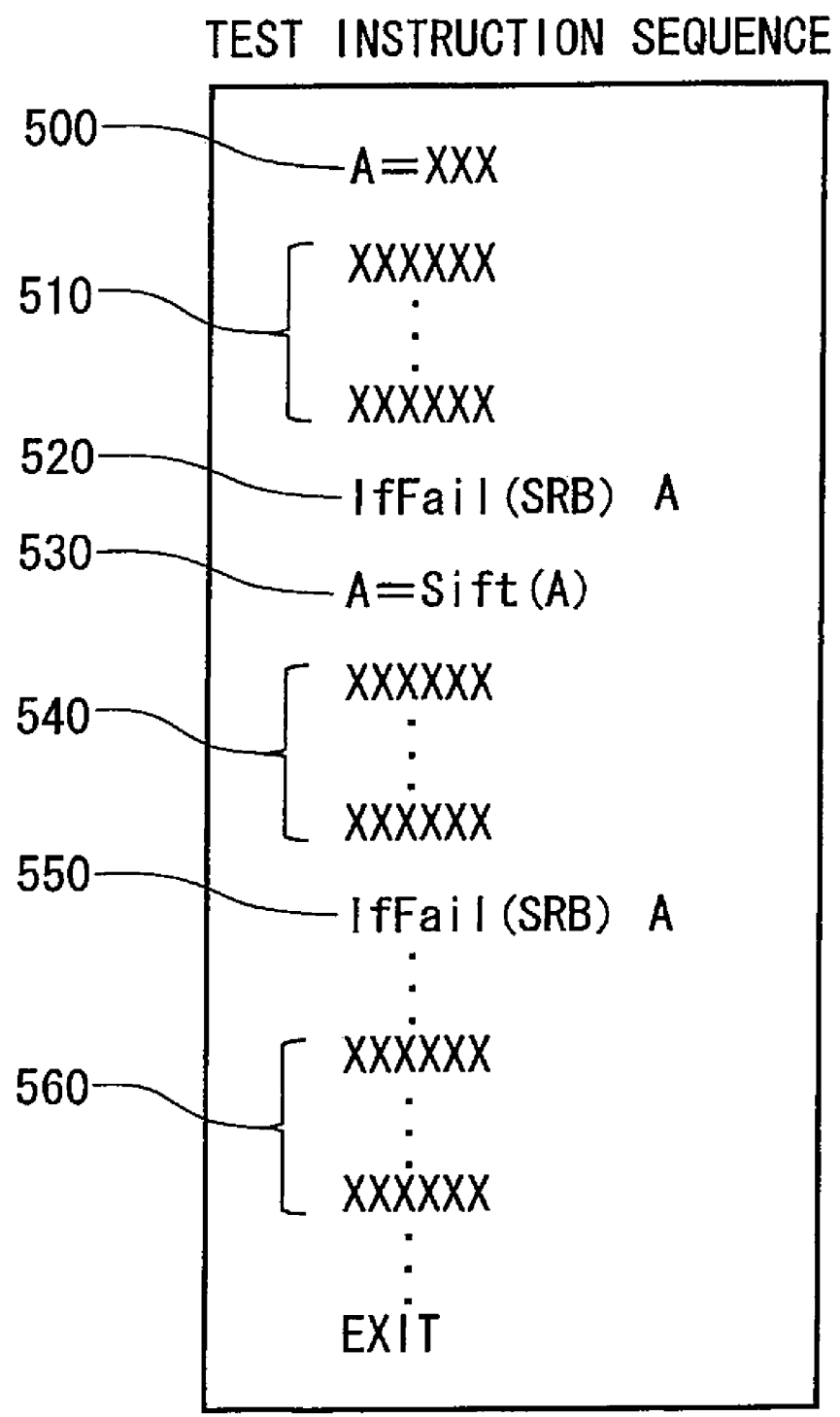
FIG. 7 illustrates an example of sequence data (a test instruction sequence) executed by the pattern generating section 70 relating to the modification example.

FIG. 7 illustrates an example of sequence data (a test instruction sequence) executed by the pattern generating section 70 relating to the present modification example. The sequence cache memory 310 may store thereon sequence data including, for example, a storing instruction 500, a first test instruction sequence 510, a first conditional result register update instruction 520, a first shift instruction 530, a second test instruction sequence 540, a second conditional result register update instruction 550, and a third test instruction sequence 560.

The storing instruction 500 is an instruction to store initial data onto the update register 350. The first test instruction sequence 510 includes a plurality of instructions specifying a test sequence for a first test. The first conditional result register update instruction 520 is an instruction to set the value of a bit position in the result register 340 which is designated by the value stored on the update register 350 to "1", under the condition that the first test shows a predetermined result (for example, Fail).

The first shift instruction 530 is an instruction to shift the value stored on the update register 350 by one bit. The second test instruction sequence 540 includes a plurality of instructions specifying a test sequence for a second test to be conducted after the first test. The second conditional result register update instruction 550 is an instruction to set the value of a bit position in the result register 340 which is designated by the value stored on the update register 350 to "1", under the condition that the second test shows a predetermined result (for example, Fail). The third test instruction sequence 560 includes a plurality of instructions specifying a test sequence for a third test to be conducted after the first and second tests.

Figure 8:
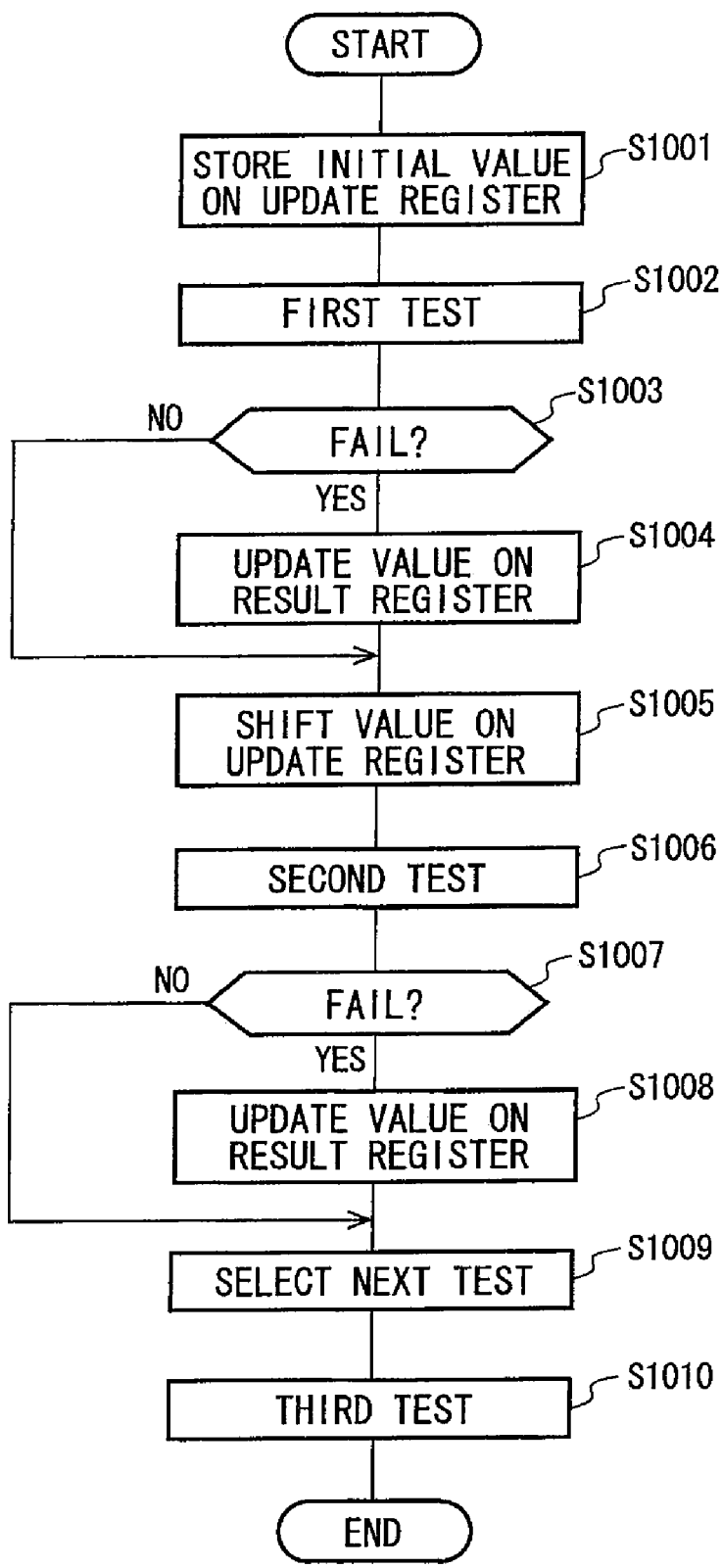
FIG. 8 illustrates an example of a flow of processes performed when the test instruction sequence shown in FIG. 7 is executed.

FIG. 8 illustrates an example of a flow of processes performed when the test instruction sequence shown in FIG. 7 is executed. To start with, the instruction executing section 320 reads the storing instruction 500, and stores initial data designating a bit position in the result register 340 onto the update register 350 before conducting the first test (step S1001). Here, the instruction executing section 320 stores, onto the update register 350 as the initial data, data in which a bit corresponding to a bit (a first bit) in tie result register 340 which is to store thereon the result of the first test has a value of "1" and the other bits have a value of "0".

Subsequently, the instruction executing section 320 reads the first test instruction sequence 510, to conduct the first test (step S1002). On completion of the first test, the instruction executing section 320 then reads the first conditional result register update instruction 520, and judges whether the result of the first test indicates Fail (step S1003). When the result of the first test indicates Fail (step S1003:YES), the instruction executing section 320 updates the value of the result register 340 by calculating a logical OR between the value stored on the result register 340 and the data stored on the update register 350 (step S1004). In this way, the instruction executing section 320 can set the value of the first bit in the result register 340 which is configured to store thereon the result of the first test to "1". When the result of the first test does not indicate Fail (step S1004:NO), the instruction executing section 320 does not update the value stored on the result register 340, and subsequently performs a step S1005.

After this, the instruction executing section 320 reads the first shift instruction 530, to shift the value stored on the update register 350 by, for example, one bit (step S1005). As a result of this operation, in the data stored on the update register 350, the value of "1" is shifted from the bit corresponding to the first bit (the bit to store thereon the result of the first test) to a different bit. Therefore, as a result of the bit shift operation, the data stored on the update register 350 is converted into data in which a bit corresponding to a bit (a second bit) to store thereon the result of the second test has the value of "1" and the other bits have the value of "0".

Following this, the instruction executing section 320 reads the second test instruction sequence 540, to conduct the second test (step S1006). On completion of the second test, the instruction executing section 320 subsequently reads the second conditional result register update instruction 550, and judges whether the result of the second test indicates Fail (step S1007). When the result of the second test indicates Fail (step S1007:YES), the instruction executing section 320 updates the value stored on the result register 340 by calculating a logical OR between the value stored on the result register 340 and the data stored on the update register 350 (step S1008). In this way, the instruction executing section 320 can set the value of the second bit in the result register 340 which is configured to store thereon the result of the second test to "1". When the result of the second test does not indicate Fail (step S1007:NO), the instruction executing section 320 does not update the value stored on the result register 340, and subsequently performs a step S1009.

After this, the instruction executing section 320 reads the value stored on the result register 340, and selects the next test to conduct based on the results of the first and second tests (step S1009). Subsequently, the instruction executing section 320 reads the third test instruction sequence 560, to conduct the third test corresponding to the selected test (step S1010).

As described above, the instruction executing section 320 can store the results of the first and second tests onto the result register 340. With this configuration, the instruction executing section 320 can conduct the third test which is selected based on the results of the first and second tests, after conducting the first and second tests. Also, the instruction executing section 320 can evaluate the DUT 300 in terms of quality based on the results of the first and second tests.

Here, the instruction executing section 320 may conduct another test in the same manner as in the steps S1005 to S1008, between the steps S1008 and S1009. With this configuration, the instruction executing section 320 can store, onto the result register 340, the results of three or more tests.

Figure 9:
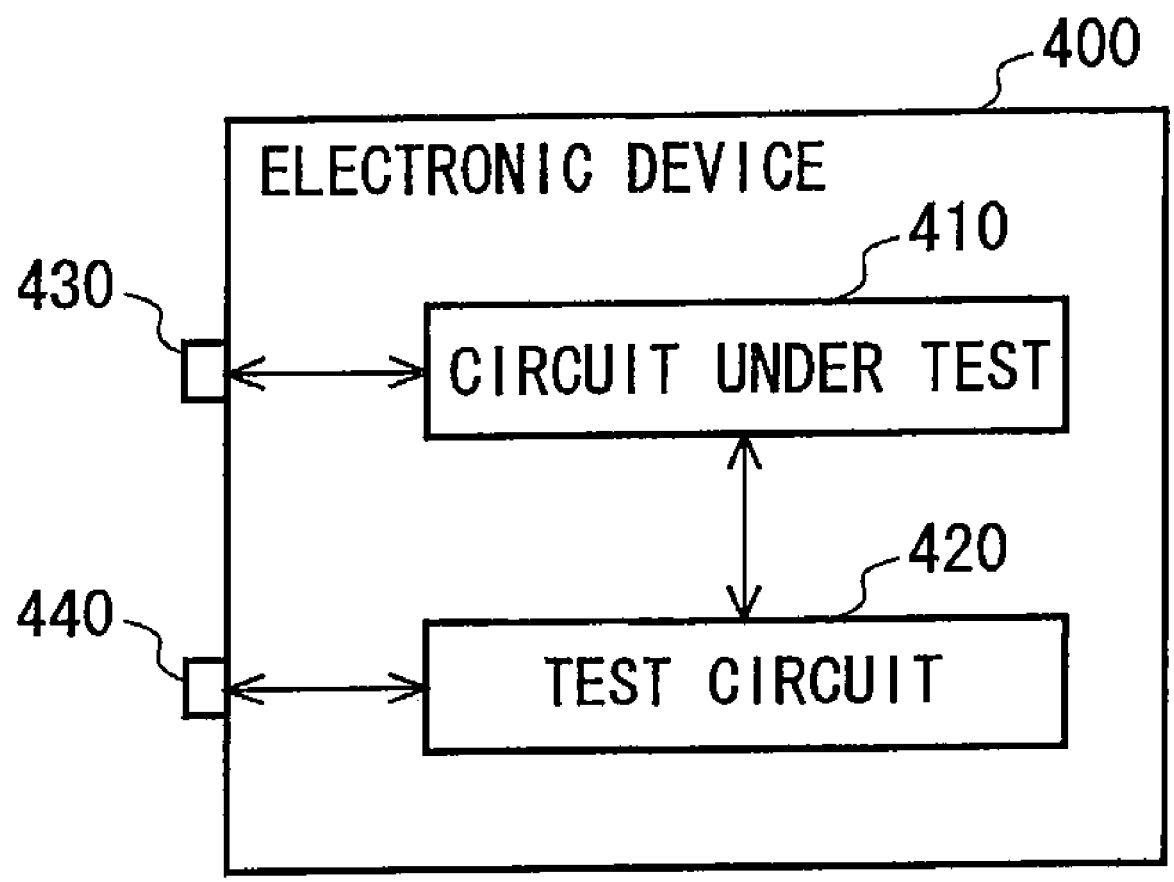
FIG. 9 illustrates an exemplary configuration of an electronic device 400 relating to an embodiment of the present invention.

FIG. 9 illustrates an exemplary configuration of an electronic device 400 relating to an embodiment of the present invention. The electronic device 400 includes therein a circuit under test 410, a test circuit 420, an input/output pin 430, and a BIST pin 440. The circuit under test 410 may be a circuit which operates when the electronic device 400 is mounted. The circuit under test 410 operates in accordance with a signal supplied thereto from the input/output pin 430 when the electronic device 400 is mounted.

When the electronic device 400 is a memory device, for example, the circuit under test 410 may be a circuit including a memory cell of the electronic device 400. For example, tie circuit under test 410 may include the memory cell and a control circuit for controlling the memory cell. The control circuit may be a circuit for controlling writing of data into the memory cell and reading of data from the memory cell.

The test circuit 420 is provided on the same semiconductor clip as the circuit under test 410. The test circuit 420 tests the circuit under test 410. The test circuit 420 may have the same constituents as the test module 100 described with reference to FIGS. 1 to 8. Alternatively, the test circuit 420 may have some of the constituents of the test module 100. The test circuit 420 may be a circuit which has some of the functions of the test module 100. For example, the test circuit 420 may not include therein the result memory 16. Furthermore, the rate generating section 30 and timing generating section 56 of the test circuit 420 may operate in accordance with the timing set including fixed values.

When supplied with a signal indicating that a self-test for the circuit under test 410 is to be executed, via the BIST pin 440 from an external test apparatus, the test circuit 420 may test the circuit under test 410. The BIST pin 440 is preferably a pin which is not used when the electronic device 400 is mounted. The test circuit 420 may output the result of testing the circuit under test 410, to tie external test apparatus via the BIST pin 440.

The external test apparatus may operate in the same manner as the site control devices 130 described with reference to FIG. 1. In other words, the external test apparatus may supply the test control programs, test programs, test data and the like, to the test circuit 420, so as to cause the test circuit 420 to function in the same manner as the test module 100 described with reference to FIGS. 1 to 8.

While one aspect of the present invention has been described the embodiments, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

What is claimed is:

1. A test apparatus for testing a device under test, comprising:
   an instruction storing section that stores thereon a test instruction sequence;
   a pattern generating section that sequentially reads and executes an instruction from the test instruction sequence, and outputs a test pattern associated with the executed instruction;
   a test signal output section that generates a test signal in accordance with the test pattern, and supplies the generated test signal to the device under test; and
   a result register that stores thereon a value having a predetermined number of bits, wherein
   the instruction storing section stores thereon the test instruction sequence including therein a result register update instruction to update a value of a designated bit position in the result register with a predetermined value, and
   when executing the result register update instruction, the pattern generating section updates, with the predetermined value, the value of the bit position in the result register which is designated by the result register update instruction.

2. The test apparatus as set forth in claim 1, wherein
   when executing the result register update instruction, the pattern generating section updates the value stored on the result register by calculating a logical OR between the value stored on the result register and data in which a bit corresponding to a bit in the result register which is to be set has a value of "1" and a bit corresponding to a bit in the result register which is not to be changed has a value of "0".

3. The test apparatus as set forth in claim 1, wherein
   when executing the result register update instruction, the pattern generating section updates the value stored on the result register by calculating a logical AND between the value stored on the result register and data generated by inverting each bit of data in which a bit corresponding to a bit in the result register which is to be reset has a value of "1" and a bit corresponding to a bit in the result register which is not to be changed has a value of "0".

4. The test apparatus as set forth in claim 1, wherein
   the instruction storing section stores thereon the test instruction sequence including therein a conditional result register update instruction to update a value of a designated bit position in the result register with a predetermined value, under a condition that a predetermined test result is obtained, and when executing the conditional result register update instruction, the pattern generating section updates, with the predetermined value, the value of the bit position in the result register which is designated by the conditional result register update instruction, under the condition that the predetermined test result is obtained.

5. The test apparatus as set forth in claim 1, further comprising an update register that stores thereon a value which designates a bit position in the result register whose value is to be updated, wherein when executing the result register update instruction, the pattern generating section updates, with the predetermined value, a value of a bit position in the result register which is designated by the value stored on the update register.

6. The test apparatus as set forth in claim 5, wherein the instruction storing section stores thereon:

a first test instruction sequence to conduct a first test;

a second test instruction sequence to conduct a second test after the first test;

a first conditional result register update instruction to update, with a predetermined value, a value of a designated bit position in the result register, under a condition that the first test shows a predetermined result; and a second conditional result register update instruction to update, with a predetermined value, a value of a designated bit position in the result register, under a condition that the second test shows a predetermined result, the second conditional result register update instruction being executed after the first conditional result register update instruction, the update register stores the value designating a bit position in the result register, prior to the first test, and the pattern generating section:

when executing the first conditional result register update instruction, updates the value of the bit position in the result register which is designated by the value stored on the update register and associated with the first test, with a value indicating the result of the first test, under the condition that the first test shows the predetermined result;

shifts the value stored on the update register so as to indicate a bit position in the result register which is associated with the second test; and when executing the second conditional result register update instruction, updates the value of the bit position in the result register which is designated by the value stored on the update register and associated with the second test, with a value indicating the result of the second test, under a condition that the second test shows the predetermined result.

7. An electronic device comprising:

a circuit under test; and a test circuit that tests the circuit under test, wherein the test circuit includes:

an instruction storing section that stores thereon a test instruction sequence;

a pattern generating section that sequentially reads and executes an instruction from the test instruction sequence, and outputs a test pattern associated with the executed instruction;

a test signal output section that generates a test signal in accordance with the test pattern, and supplies the generated test signal to the circuit under test; and a result register that stores thereon a value having a predetermined number of bits, wherein the instruction storing section stores thereon the test instruction sequence including therein a result register update instruction to update a value of a designated bit position in the result register with a predetermined value, and when executing the result register update instruction, the pattern generating section updates, with the predetermined value, the value of the bit position in the result register which is designated by the result register update instruction.

\* \* \* \* \*